(12) United States Patent
Ye

(10) Patent No.: US 11,172,279 B1
(45) Date of Patent: Nov. 9, 2021

(54) MICROPHONE WITH COMBINED PACKAGING STRUCTURE

(71) Applicants: ZILLTEK TECHNOLOGY (SHANGHAI) CORP., Shanghai (CN); ZILLTEK TECHNOLOGY CORP., Hsinchu (TW)

(72) Inventor: Jinghua Ye, Shanghai (CN)

(*) Notice: Subject to any disclaimer, the term of this patent is extended or adjusted under 35 U.S.C. 154(b) by 0 days.

(21) Appl. No.: 17/094,060

(22) Filed: Nov. 10, 2020

(30) Foreign Application Priority Data

Jul. 24, 2020 (CN) .......................... 202010724484.X

(51) Int. Cl.
 *H04R 1/08* (2006.01)
(52) U.S. Cl.
 CPC .......... *H04R 1/08* (2013.01); *H04R 2201/003* (2013.01)
(58) Field of Classification Search
 CPC ... H04R 1/00; H04R 1/02; H04R 1/04; H04R 1/083; H04R 19/04; H04R 19/005; H04R 2201/00; H04R 2201/021; H04R 2201/003; H04R 2201/025; H04R 2410/00; B81B 7/0032; B81B 7/0077; B81B 2201/0257; B81N 2207/09; B81N 2207/097; H01L 2924/14; H01L 2924/1461; H01L 2924/15
 See application file for complete search history.

(56) References Cited

U.S. PATENT DOCUMENTS

| | | | | |
|---|---|---|---|---|
| 10,123,112 | B2* | 11/2018 | Murgia | H04R 3/005 |
| 2008/0192962 | A1* | 8/2008 | Halteren | H04R 1/222 381/170 |
| 2010/0303274 | A1* | 12/2010 | Ryan | H04R 1/222 381/361 |
| 2015/0023523 | A1* | 1/2015 | Elian | B81B 7/0061 381/91 |
| 2016/0234604 | A1* | 8/2016 | Saxena | H04R 1/04 |
| 2016/0261941 | A1* | 9/2016 | Brioschi | H04R 19/04 |
| 2017/0164107 | A1* | 6/2017 | Murgia | H04R 3/005 |
| 2018/0063614 | A1* | 3/2018 | Yeh | H04R 1/04 |
| 2020/0057158 | A1* | 2/2020 | Chua | G01S 7/4811 |
| 2020/0304920 | A1* | 9/2020 | Achehboune | B81B 7/0061 |

* cited by examiner

*Primary Examiner* — Thang V Tran
(74) *Attorney, Agent, or Firm* — Clement Cheng

(57) ABSTRACT

A microphone with a combined packaging structure includes: a substrate, a first cover being provided on top of the substrate, the substrate, together with the first cover, forms a first accommodating cavity, an acoustic sensor being provided inside the first accommodating cavity, and an acoustic through-hole being formed in the first accommodating cavity. A second cover is provided on a back face of the substrate, the second cover, together with the substrate, forms a second accommodating cavity, and a proximity sensor is arranged inside the second accommodating cavity. By adopting the above-mentioned technical solutions, the present invention has the beneficial effects that two accommodating cavities are respectively provided on the top and bottom of the substrate in the microphone according to the present invention, for receiving components of a MEMS microphone and the components of a proximity sensor respectively.

9 Claims, 1 Drawing Sheet

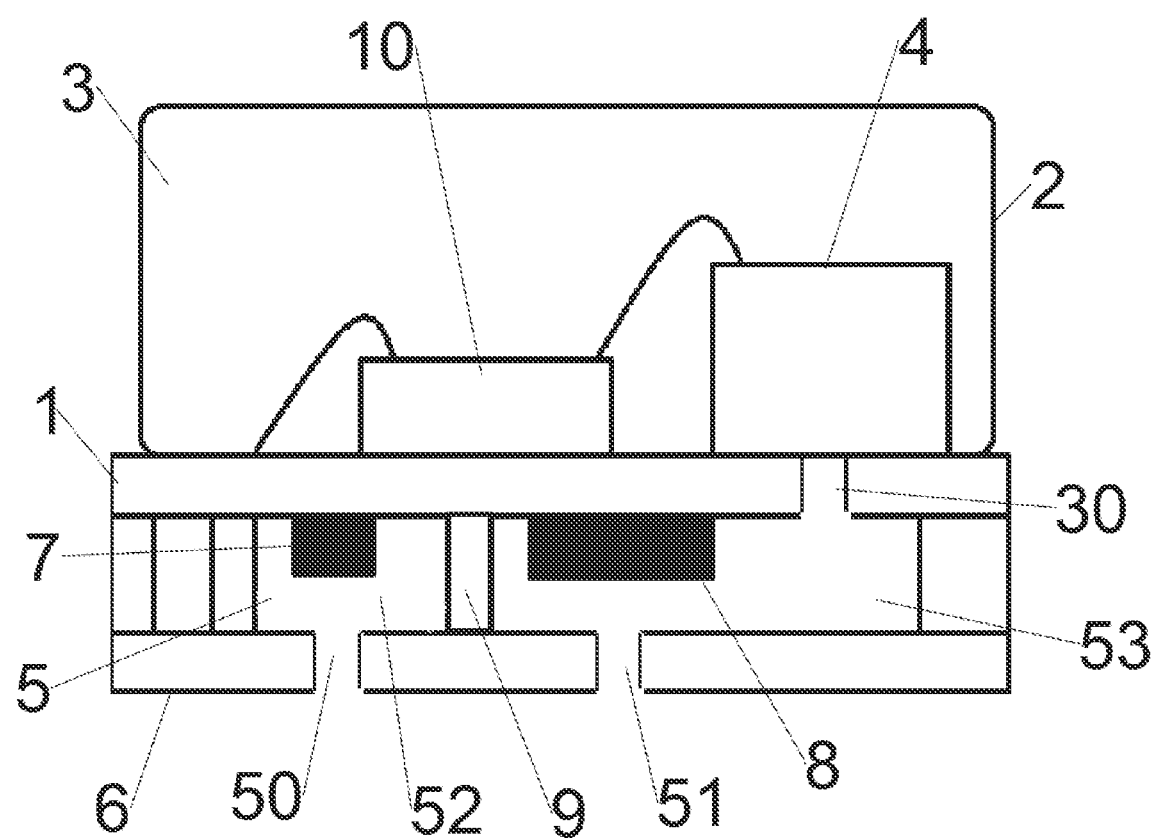

MICROPHONE WITH COMBINED PACKAGING STRUCTURE

BACKGROUND OF THE INVENTION

1. Field of the Invention

The invention relates to the field of microphones, and more particularly, to a microphone with a combined packaging structure.

2. Description of the Related Art

A MEMS (Micro Electro Mechanical System) microphone is a microphone that is produced using MEMS techniques. The existing MEMS microphone has advantages that it has the ability to withstand an extremely high reflow soldering temperature; it can be easily integrated with CMOS processes and other audio circuits; and it has improved noise cancellation performance and good RF and EMI suppression effects.

The existing MEMS microphone is packaged in a relatively simple way. By way of example, for a multi-function microphone, electronic components with additional functions are installed in the same microphone cavity, occupying an acoustic cavity in the microphone, thereby affecting the acoustic performance of the microphone.

SUMMARY OF THE INVENTION

An object of the present invention is to provide a microphone with a combined packaging structure to solve the above-mentioned technical problems.

The technical problems in the present invention can be solved by adopting the following technical solutions:

a microphone with a combined packaging structure, comprising:

a substrate, a first cover being provided on top of the substrate, the substrate, together with the first cover, forms a first accommodating cavity, an acoustic sensor being provided inside the first accommodating cavity, and an acoustic through-hole being formed in the first accommodating cavity;

wherein, a second cover is provided on a back face of the substrate, the second cover, together with the substrate, forms a second accommodating cavity, and a proximity sensor is arranged inside the second accommodating cavity.

Preferably, the acoustic through-hole is formed on the substrate.

Preferably, a position of the acoustic through-hole corresponds to that of the acoustic sensor.

Preferably, the acoustic sensor is connected to an Application Specific Integrated Circuit (ASIC) chip, the ASIC chip is disposed on a top surface of the substrate.

Preferably, the proximity sensor comprises an infrared emitting unit and an infrared receiving unit.

Preferably, an infrared emitting hole is formed in the second accommodating cavity in a direction corresponding to the direction of emitting of infrared ray of the infrared emitting unit, and an infrared receiving hole is formed in the second accommodating cavity in a so direction corresponding to the direction of incidence of infrared ray of the infrared receiving unit.

Preferably, the second accommodating cavity comprises a separating unit for separating the second accommodating cavity into a first sub-cavity and a second sub-cavity, the second sub-cavity communicates with the acoustic through-hole, the infrared emitting unit is disposed inside the first sub-cavity, and the infrared receiving unit is disposed inside the second sub-cavity.

Preferably, the infrared emitting unit is electrically connected to the substrate, and the infrared receiving unit is also electrically connected to the substrate.

Preferably, the second cover comprises a bottom plate and a plurality of pillars, the bottom plate is parallel to the substrate, and the plurality of pillars are connected between the bottom plate and the substrate.

By adopting the above-mentioned technical solutions, the present invention has the beneficial effects that two accommodating cavities are respectively provided on the top and bottom of the substrate in the microphone according to the present invention, for receiving the components of a MEMS microphone and the components of a proximity sensor respectively, so that the components of the microphone and the proximity sensor can be well separated from each other. In this way, the problem of non-microphone functional components occupying the acoustic cavity of the microphone is avoided, the sound quality and acoustic performance of the microphone is improved, and the structure of the multi-functional microphone becomes compacter without sacrificing multi-functions of the microphone.

BRIEF DESCRIPTION OF THE DRAWINGS

The accompanying drawings, together with the specification, so illustrate exemplary embodiments of the present disclosure, and, together with the description, serve to explain the principles of the present invention.

FIG. 1 is a cross-sectional view showing a structure of a microphone with a combined packaging structure according to the present invention.

In the accompanying drawings: 1—substrate; 2—first cover; 3—first accommodating cavity; 4—acoustic sensor; 5—second accommodating cavity; 6—second cover; 7—infrared emitting unit; 8—infrared receiving unit; 9—separating unit; 10—Application Specific Integrated Circuit (ASIC) chip;

50—infrared emitting hole; 51—infrared receiving hole; 52—first sub-cavity; 53—second sub-cavity.

DETAILED DESCRIPTION

The technical solution set forth in the embodiments of the present invention will now be described clearly and fully hereinafter with reference to the accompanying drawings of the embodiments of the present invention. Obviously, such embodiments provided in the present invention are only part of the embodiments instead of all embodiments. It should be understood that all the other embodiments obtained from the embodiments set forth in the present invention by one skilled in the art without any creative work fall within the scope of the present invention.

Notably, the embodiments set forth in the present invention and features of the embodiments may be combined in any suitable manner.

The present invention will be described hereinafter with reference to the accompanying drawings and particular embodiments, but the invention is not limited thereto.

As shown in FIG. 1, the present invention provides a microphone with a combined packaging structure, comprising: a substrate 1, a first cover 2 being provided on top of the substrate 1, the substrate 1, together with the first cover 2, forms a first accommodating cavity 3, an acoustic sensor 4 being provided inside the first accommodating cavity 3, and an acoustic through-hole 30 being formed in the first accommodating cavity 3;

wherein, a second cover 6 is provided on a back face of the substrate 1, the second cover 6, together with the substrate 1, forms a second accommodating cavity 5, and a proximity sensor is arranged inside the second accommodating cavity 5.

By adopting the above-mentioned technical solutions, the present invention has the beneficial effects that two accommodating cavities are respectively provided on the top and bottom of the substrate in the microphone according to the present invention, for receiving the components of a MEMS microphone and the components of a proximity sensor respectively, so that the components of the microphone and the proximity sensor can be well separated from each other. In this way, the problem of non-microphone functional components occupying the acoustic cavity of the microphone is avoided, the sound quality and acoustic performance of the microphone is improved, and the structure of the multi-functional microphone becomes compacter without sacrificing multi-functions of the microphone.

As a preferred embodiment of the present invention, the second cover 2 comprises a bottom plate and a plurality of pillars, the bottom plate is parallel to the substrate, axes of the pillars are perpendicular to the substrate and the bottom plate, and the plurality of pillars are connected between the bottom plate and the substrate. The bottom plate is connected to the substrate through the plurality pillars so as to form the second cover. As a result, more space of the second accommodating cavity 5 is available for adjustment, the structure is more compact, and it is easier to install the proximity sensor.

As a preferred embodiment of the present invention, the acoustic through-hole 30 is formed on the substrate 1.

As a preferred embodiment of the present invention, a position of the acoustic through-hole 30 corresponds to that of the acoustic sensor 4, which allows the acoustic sensor 4 to receive a sound signal from the outside faster.

As a preferred embodiment of the present invention, the acoustic sensor 4 is connected to an Application Specific Integrated Circuit (ASIC) chip 10, the ASIC chip 10 is disposed on a top surface of the substrate 1.

The ASIC chip 10 may convert a signal sent by the acoustic sensor into a suitable electrical signal, and then the electrical signal is output.

In addition, the acoustic sensor 4 and the proximity sensor may use the same ASIC chip 10 as described above. The ASIC chip 10 may convert signals sent from the acoustic sensor 4 and signals sent from the proximity sensor into required electrical signals respectively, and then the electrical signals are output.

As a preferred embodiment of the present invention, the proximity sensor comprises an infrared emitting unit 7 and an infrared receiving unit 8.

As a preferred embodiment of the present invention, the infrared emitting unit 7 is electrically connected to the substrate 1, and the infrared receiving unit 8 is also electrically connected to the substrate 1. Both the infrared emitting unit and the infrared receiving unit are powered by the circuit of the microphone.

As a preferred embodiment of the present invention, an infrared emitting hole 50 is formed in the second accommodating cavity 5 in a direction corresponding to the direction of emitting of infrared ray of the infrared emitting unit 7, and an infrared receiving hole 51 is formed in the second accommodating cavity 5 in a direction corresponding to the direction of incidence of infrared ray of the infrared receiving unit 8. When moving towards the infrared emitting unit 7 in a direction of emitting of infrared ray of the infrared emitting hole 50 and reaches a pre-set reflective distance, an object may then reflect infrared ray emitted by the infrared emitting unit 7, the reflected infrared ray enters into the second accommodating cavity through the infrared receiving hole 51, and the infrared ray is received by the infrared receiving unit 8.

As a preferred embodiment of the present invention, the second accommodating cavity 5 comprises a separating unit 9 for separating the second accommodating cavity 5 into a first sub-cavity 52 and a second sub-cavity 53, the second sub-cavity 53 communicates with the acoustic through-hole 30, the infrared emitting unit 7 is disposed inside the first sub-cavity 52, and the infrared receiving unit 8 is disposed inside the second sub-cavity 53. The external sound signals may enter the cavity of the microphone via the second sub-cavity and the acoustic through-hole 30, thus the transmission of the sound signals is completed.

The separating unit 9 makes it possible to make the infrared emitting unit separate from the infrared receiving unit. When the distance between an obstacle and the infrared emitting unit exceeds a pre-set reflective distance, the infrared receiving unit cannot receive the infrared ray; only when the distance between the obstacle and the infrared emitting unit is within the pre-set reflective distance can the obstacle reflects the infrared ray, so that the infrared receiving unit can receive the infrared ray.

The above descriptions are only the preferred embodiments of the invention, not thus limiting the embodiments and scope of the invention. Those skilled in the art should be able to realize that the schemes obtained from the content of specification and drawings of the invention are within the scope of the invention.

What is claimed is:

1. A microphone with a combined packaging structure, comprising:
   a substrate, a first cover being provided on top of the substrate, the substrate, together with the first cover, forms a first accommodating cavity, an acoustic sensor being provided inside the first accommodating cavity, and an acoustic through-hole being formed in the first accommodating cavity;
   wherein, a second cover is provided on a back face of the substrate, the second cover, together with the substrate, forms a second accommodating cavity, and a proximity sensor is arranged inside the second accommodating cavity.

2. The microphone with a combined packaging structure of claim 1, wherein the acoustic through-hole is formed on the substrate.

3. The microphone with a combined packaging structure of claim 1, wherein a position of the acoustic through-hole corresponds to that of the acoustic sensor.

4. The microphone with a combined packaging structure of claim 1, wherein the acoustic sensor is connected to an Application Specific Integrated Circuit (ASIC) chip, the ASIC chip is disposed on a top surface of the substrate.

5. The microphone with a combined packaging structure of claim 1, wherein the proximity sensor comprises an infrared emitting unit and an infrared receiving unit.

6. The microphone with a combined packaging structure of claim 5, wherein an infrared emitting hole is formed in the second accommodating cavity in a direction corresponding to the direction of emitting of infrared ray of the infrared emitting unit, and an infrared receiving hole is formed in the second accommodating cavity in a direction corresponding to the direction of incidence of infrared ray of the infrared receiving unit.

7. The microphone with a combined packaging structure of claim 5, wherein the second accommodating cavity comprises a separating unit for separating the second accommodating cavity into a first sub-cavity and a second sub-cavity, the second sub-cavity communicates with the acoustic through-hole, the infrared emitting unit is disposed inside the first sub-cavity, and the infrared receiving unit is disposed inside the second sub-cavity.

8. The microphone with a combined packaging structure of claim 5, wherein the infrared emitting unit is electrically connected to the substrate, and the infrared receiving unit is also electrically connected to the substrate.

9. The microphone with a combined packaging structure of claim 1, wherein the second cover comprises a bottom plate and a plurality of pillars, the bottom plate is parallel to the substrate, and the plurality of pillars are connected between the bottom plate and the substrate.

\* \* \* \* \*